US012641820B2

(12) United States Patent
Enari et al.

(10) Patent No.: US 12,641,820 B2
(45) Date of Patent: May 26, 2026

(54) SEMICONDUCTOR DEVICE AND METHOD OF MANUFACTURING THE SAME

(71) Applicant: RENESAS ELECTRONICS CORPORATION, Tokyo (JP)

(72) Inventors: Yuji Enari, Tokyo (JP); Takashi Tonegawa, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 353 days.

(21) Appl. No.: 18/452,805

(22) Filed: Aug. 21, 2023

(65) Prior Publication Data

US 2024/0162343 A1 May 16, 2024

(30) Foreign Application Priority Data

Nov. 14, 2022 (JP) ................................. 2022-182008

(51) Int. Cl.
| | |
|---|---|
| *H10D 30/66* | (2025.01) |
| *H10D 30/01* | (2025.01) |
| *H10D 62/17* | (2025.01) |
| *H10W 72/90* | (2026.01) |

(52) U.S. Cl.
CPC ......... *H10D 30/66* (2025.01); *H10D 30/0291* (2025.01); *H10D 62/393* (2025.01); *H10W 72/942* (2026.01); *H10W 72/90* (2026.01);

*H10W 72/923* (2026.01); *H10W 72/926* (2026.01); *H10W 72/934* (2026.01); *H10W 72/936* (2026.01); *H10W 72/9415* (2026.01)

(58) Field of Classification Search
CPC ....... H05K 1/116; H05K 3/4647; H05K 3/424
See application file for complete search history.

(56) References Cited

U.S. PATENT DOCUMENTS

| | | | | |
|---|---|---|---|---|
| 11,456,265 | B2 | 9/2022 | Tonegawa | |
| 2024/0128218 | A1* | 4/2024 | Chang | ............... H01L 23/49816 |
| 2024/0145352 | A1* | 5/2024 | Nishihara | ............... H01L 23/13 |
| 2025/0087612 | A1* | 3/2025 | An | ........................... H01L 24/13 |

FOREIGN PATENT DOCUMENTS

JP 2020-120133 A 8/2020

* cited by examiner

*Primary Examiner* — Edward Chin

(74) *Attorney, Agent, or Firm* — Rimon P.C.

(57) ABSTRACT

An interlayer insulating film is formed on an upper surface of a semiconductor substrate. A source pad and a kelvin pad, a gate pad, and a drain pad each having a smaller plane area than a plane area of the source pad are formed on the interlayer insulating film. A first plating layer is formed on the source pad. A second plating layer is formed on each of the kelvin pad, the gate pad, and the drain pad. A material of an uppermost surface of the first plating layer is a metal other than a noble metal, and a material of an uppermost surface of the second plating layer is a noble metal.

5 Claims, 19 Drawing Sheets

<KELVIN PAD>
<GATE PAD>
<DRAIN PAD>

<SOURCE PAD>

<SOURCE PAD>

<KELVIN PAD>
<GATE PAD>
<DRAIN PAD>

*FIG. 7*

<SOURCE PAD>

<KELVIN PAD>
<GATE PAD>
<DRAIN PAD>

RP1  PF1  SD1  IF1  IL  SUB

SW  SP  OP1

RP1  RP1  PF2  SD1  IF1  IL  SUB

<SOURCE PAD>

<KELVIN PAD>
<GATE PAD>
<DRAIN PAD>

<SOURCE PAD>

<KELVIN PAD>
<GATE PAD>
<DRAIN PAD>

FIG. 11

<SOURCE PAD>

<KELVIN PAD>
<GATE PAD>
<DRAIN PAD>

<SOURCE PAD>

<KELVIN PAD>
<GATE PAD>
<DRAIN PAD>

<SOURCE PAD>

<KELVIN PAD>
<GATE PAD>
<DRAIN PAD>

<SOURCE PAD>

Figure 17:
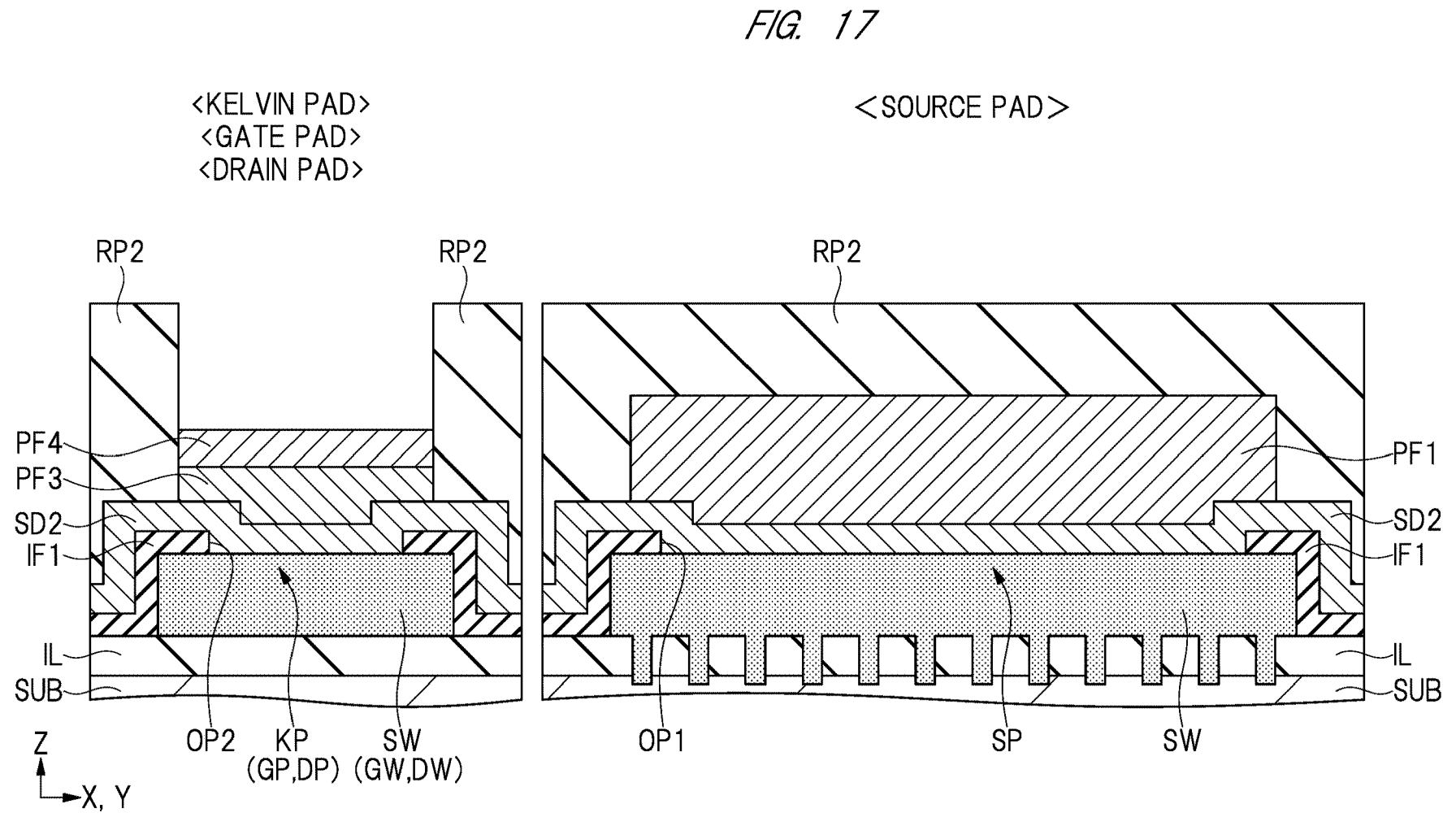

PF1
SD2
IF1
IL
SUB
RP2
SW
SP
OP1

<KELVIN PAD>
<GATE PAD>
<DRAIN PAD>

RP2
RP2
RP2
PF4
PF3
SD2
IF1
IL
SUB
SW
(GW,DW)
KP
(GP,DP)
OP2
Z
X, Y

SEMICONDUCTOR DEVICE AND METHOD OF MANUFACTURING THE SAME

CROSS-REFERENCE TO RELATED APPLICATION

The disclosure of Japanese Patent Application No. 2022-182008 filed on Nov. 14, 2022, including the specification, drawings and abstract is incorporated herein by reference in its entirety.

BACKGROUND

The present invention relates to a semiconductor device and a method of manufacturing the same, and particularly to a semiconductor device including a plating layer formed on a pad and a method of manufacturing the same.

From requests such as a request to enhance the reliability of a semiconductor device, a structure in which a conductive layer referred to as an OPM (over pad metal) electrode is formed on a pad as a part of a wiring formed on a semiconductor substrate has been proposed. An external connection member such as a bonding wire or a clip is connected to the OPM electrode.

In a semiconductor device including a power MOSFET (Metal Oxide Semiconductor Field Effect Transistor), a plurality of pads to be connected to external connection members such as bonding wires is provided on an upper surface of a semiconductor substrate. Examples of the plurality of pads include a source pad, a gate pad, a drain pad, and a kelvin pad. The source pad is electrically connected to a source region of the MOSFET, the gate pad is electrically connected to a gate electrode of the MOSFET, and the drain pad is electrically connected to a drain region of the MOSFET. The kelvin pad and the source pad are respectively parts of the same wiring, and are positioned in different regions. The kelvin pad and the drain pad are respectively pads provided to detect signals from the source region and the drain region of the MOSFET.

There is disclosed technique listed below.
[Patent Document 1] Japanese Unexamined Patent Application Publication No. 2020-120133

For example, the Patent document 1 discloses a technique for forming a power MOSFET in a semiconductor substrate and forming a nickel film, a palladium film, and a gold film as an OMP electrode on each of pads. The nickel film, the palladium film, and the gold film are formed by an electroless plating method. The electroless plating method is effective in terms of a decrease in the number of manufacturing steps and a decrease in manufacturing cost because the OPM electrodes can be collectively formed on the pads.

SUMMARY

The inventors of the present application have studied an OPM electrode obtained by sequentially stacking a nickel film, a palladium film, and a gold film by using an electroless plating method in the semiconductor device including the power MOSFET. As a result, it has been found that, defective deposition of gold occurs in some of the pads, and such a malfunction (non-adhesion of the gold film) that is failure to form the gold film occurs on a part of the palladium film. Particularly, it has been found that such a malfunction tends to occur in the kelvin pad and the drain pad.

In the semiconductor device including the power MOS-FET, the plane area of the source pad occupies a large part of the plane area of the semiconductor substrate. Accordingly, in the kelvin pad unified with the source pad as the same wiring, electrons required to form a plating film tend to be concentrated on the source pad. As a result, it has been found that the supply of electrons is insufficient so that non-adhesion of the gold film tends to occur in the kelvin pad having a small area. Particularly, it has been found that non-adhesion of the gold film tends to occur when the plane area of the source pad is 100 times or more the plane area of the kelvin pad.

Although the drain pad is electrically connected to the drain region formed on a lower surface of the semiconductor substrate, electrons required to form the plating film tend to be concentrated on the lower surface of the semiconductor substrate when the plating film is formed. As a result, it has been found that the supply of electrons is insufficient so that non-adhesion of the gold film tends to occur even in the drain pad.

Such non-adhesion of the gold film becomes a factor of a malfunction such as defective bonding when the pad and the bonding wire are connected to each other. Therefore, there occurs a problem of a decrease in yield at the time of mounting. An inspection process for detecting a defect needs to be added, and therefore, a manufacturing cost increases.

A gold film formed of a noble metal is formed on the source pad having a large area. The gold film is formed of a material relatively expensive among noble metals. Therefore, when the gold film is formed on an entire surface of the source pad having a large area, the manufacturing cost increases.

A principal object of the present application is to suppress non-adhesion of a gold film occurring in a pad having a small area, and is to improve reliability of a semiconductor device. Another object of the present application is to suppress an increase in manufacturing cost. Other problems and novel characteristics will be apparent from the description of the present specification and the accompanying drawings.

The outline of the typical aspects of the embodiments disclosed in the present application will be briefly described as follows.

According to one embodiment, a semiconductor device includes a semiconductor substrate having an upper surface, an interlayer insulating film formed on the upper surface of the semiconductor substrate, a first pad formed on the interlayer insulating film, a second pad formed on the interlayer insulating film and having a smaller plane area than a plane area of the first pad, a first plating layer formed on the first pad, a second plating layer formed on the second pad. A material of an uppermost surface of the first plating layer is a metal other than a noble metal, and a material of an uppermost surface of the second plating layer is a noble metal.

According to one embodiment, a method of manufacturing a semiconductor device includes: (a) preparing a semiconductor substrate having an upper surface, (b) forming an interlayer insulating film on the upper surface of the semiconductor substrate, (c) forming a first pad and a second pad having a smaller plane area than a plane area of the first pad on the interlayer insulating film, (d) forming a seed layer on the first pad and the second pad by a sputtering method, (e) forming a first plating film on the seed layer on the first pad and forming a second plating film on the seed layer on the second pad by an electrolytic plating method, (f) forming a third plating film on the second plating film by an electrolytic plating method, and (g) forming a fourth plating film on the third plating film by an electrolytic plating method. A material forming the third plating film differs from a material forming each of the first plating film and the second plating film, a material forming the fourth plating film differs from a material forming each of the first plating film, the second plating film, and the third plating film, a material forming each of the first plating film and the second plating film is a metal other than a noble metal, and a material forming the fourth plating film is a noble metal.

According to one embodiment, a method of manufacturing a semiconductor device includes: (a) preparing a semiconductor substrate having an upper surface, (b) forming an interlayer insulating film on the upper surface of the semiconductor substrate, (c) forming a first pad and a second pad having a smaller plane area than a plane area of the first pad on the interlayer insulating film, (d) forming a seed layer on the first pad and the second pad by a sputtering method, (e) forming a first plating film on the seed layer on the first pad by an electrolytic plating method, (f) forming a third plating film on the seed layer on the second pad by an electrolytic plating method, and (g) forming a fourth plating film on the third plating film by an electrolytic plating method. A material forming the third plating film differs from a material forming the first plating film, a material forming the fourth plating film differs from a material forming each of the first plating film and the third plating film, the material forming the first plating film is a metal other than a noble metal, and the material forming the fourth plating film is a noble metal.

According to one embodiment, reliability of a semiconductor device can be improved, and increase in manufacturing cost can be suppressed.

BRIEF DESCRIPTIONS OF THE DRAWINGS

FIG. 7 is a cross-sectional view illustrating a manufacturing step continued from FIG. 6.

FIG. 8 is a cross-sectional view illustrating a manufacturing step continued from FIG. 7.

FIG. 11 is a cross-sectional view illustrating a manufacturing step continued from FIG. 10.

FIG. 16 is a cross-sectional view illustrating a manufacturing step continued from FIG. 15.

FIG. 17 is a cross-sectional view illustrating a manufacturing step continued from FIG. 16.

DETAILED DESCRIPTION

Hereinafter, embodiments will be described in detail with reference to the accompanying drawings. Note that components having the same function are denoted by the same reference signs throughout the drawings for describing the embodiment, and the repetitive description thereof will be omitted. In addition, the description of the same or similar portions is not repeated in principle unless otherwise particularly required in the following embodiments.

An X-direction, a Y-direction, and a Z-direction described in the present application intersect one another and are perpendicular to one another. In the present application, the Z-direction is described as an up-down direction, a height direction, or a thickness direction of a structure. An expression such as "plan view" or "planar view" used in the present application means that a "plane" that is a surface configured in the X-direction and the Y-direction is viewed in the Z-direction.

First Embodiment

Structure of Semiconductor Device

A semiconductor device 100 according to a first embodiment will be described below with reference to FIGS. 1 to 4. The semiconductor device 100 includes a MOSFET having a trench gate structure as a semiconductor device.

Figure 1:
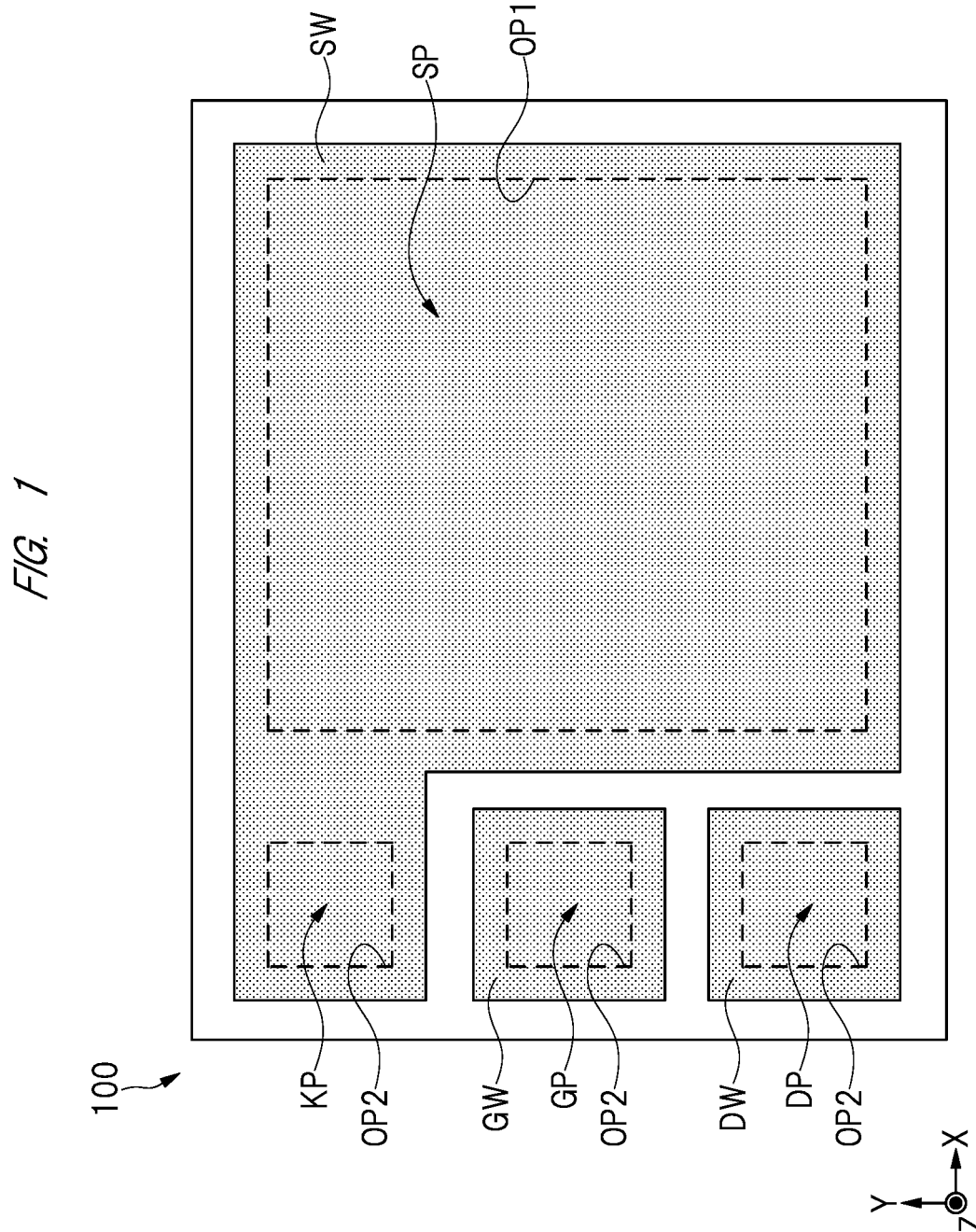
FIG. 1 is a plan view illustrating a semiconductor device according to a first embodiment.

FIG. 1 is a plan view of a semiconductor chip as the semiconductor device 100. FIG. 1 illustrates a wiring pattern mainly formed above a semiconductor substrate SUB. As illustrated in FIG. 1, a large part of the semiconductor substrate SUB is covered with a source wiring SW. A gate wiring GW and a drain wiring DW are provided around the source wiring SW.

As described below, the source wiring SW, the gate wiring GW, and the drain wiring DW are covered with an insulating film IF1. The insulating film IF1 is provided with an opening OP1 and a plurality of openings OP2. A part of the source wiring SW exposed in the opening OP1 is a source pad SP. A part of the source wiring SW exposed in the opening OP2 is a kelvin pad KP. A part of the gate wiring GW exposed in the opening OP2 is a gate pad GP. A part of the drain wiring DW exposed in the opening OP2 is a drain pad DP. The source pad SP and the kelvin pad KP are respectively parts of the same source wiring SW but positioned in different regions.

Note that the kelvin pad KP is a signal pad provided to detect a signal from a source region NS of the MOSFET. The drain pad DP is a signal pad provided to detect a signal from a drain region ND of the MOSFET.

The plane area of each of the kelvin pad KP, the gate pad GP, and the drain pad DP is smaller than the plane area of the source pad SP. The plane area of the source pad SP is, for example, 100 times or more the plane area of each of the kelvin pad KP, the gate pad GP, and the drain pad DP.

A structure under each of the source pad SP, the kelvin pad KP, the gate pad GP, and the drain pad DP will be described with reference to FIGS. 2 and 3. A plurality of MOSFETs is mainly formed under the source wiring SW (the source pad SP), and is formed in the semiconductor substrate SUB under an interlayer insulating film IL.

First, a basic structure of the MOSFET will be described with reference to FIG. 2. As illustrated in FIG. 2, the semiconductor device 100 includes the n-type semiconductor substrate SUB having an upper surface and a lower surface. A material forming the semiconductor substrate SUB is silicon. The semiconductor substrate SUB has an n-type drift region NV having a low concentration. The n-type semiconductor substrate SUB itself configures the drift region NV. Note that the drift region NV may be an n-type semiconductor layer grown while an n-type silicon substrate is doped with phosphorus (P) by an epitaxial growth method. In the present application, description is made assuming that a stacked body including the n-type silicon substrate and the n-type semiconductor layer is also the semiconductor substrate SUB.

On the upper surface of the semiconductor substrate SUB, a trench TR that reaches a predetermined depth from the upper surface of the semiconductor substrate SUB is formed in the semiconductor substrate SUB. The trench TR has a gate electrode GE formed in the trench TR to interpose a gate insulating film GI. The gate insulating film GI is, for example, a silicon oxide film. The gate electrode GE is, for example, an n-type impurity doped polycrystalline silicon film.

On the upper surface of the semiconductor substrate SUB, a p-type body region PB is formed to be shallower than the depth of the trench TR in the semiconductor substrate SUB. An n-type source region NS is formed in the body region PB. The source region NS has a higher impurity concentration than an impurity concentration of the drift region NV.

On the lower surface of the semiconductor substrate SUB, the n-type drain region ND is formed in the semiconductor substrate SUB. The drain region ND has a higher impurity concentration than the impurity concentration of the drift region NV. A drain electrode DE is formed on the lower surface of the semiconductor substrate SUB. The drain electrode DE is formed of a single-layer metal film such as an aluminum film, a titanium film, a nickel film, a gold film, or a silver film or a stacked film obtained by appropriately stacking the metal films. To the semiconductor substrate SUB (the drain region ND and the drift region NV), a drain potential is supplied from the drain electrode DE.

On the upper surface of the semiconductor substrate SUB, an interlayer insulating film IL is formed to cover the trench TR. The interlayer insulating film IL is formed of, for example, a silicon oxide film. Holes CH that reach the source region NS and the body region PB are formed in the interlayer insulating film IL. A high-concentration diffusion region PR is formed in the body region PB in a bottom portion of the hole CH. The high-concentration diffusion region PR has a higher impurity concentration than an impurity concentration of the body region PB.

The source wiring SW is formed on the interlayer insulating film IL. The source wiring SW is embedded in the hole CH, is electrically connected to the source region NS, the body region PB, and the high-connection diffusion region PR, and supplies a source potential to such impurity regions.

Figure 2:
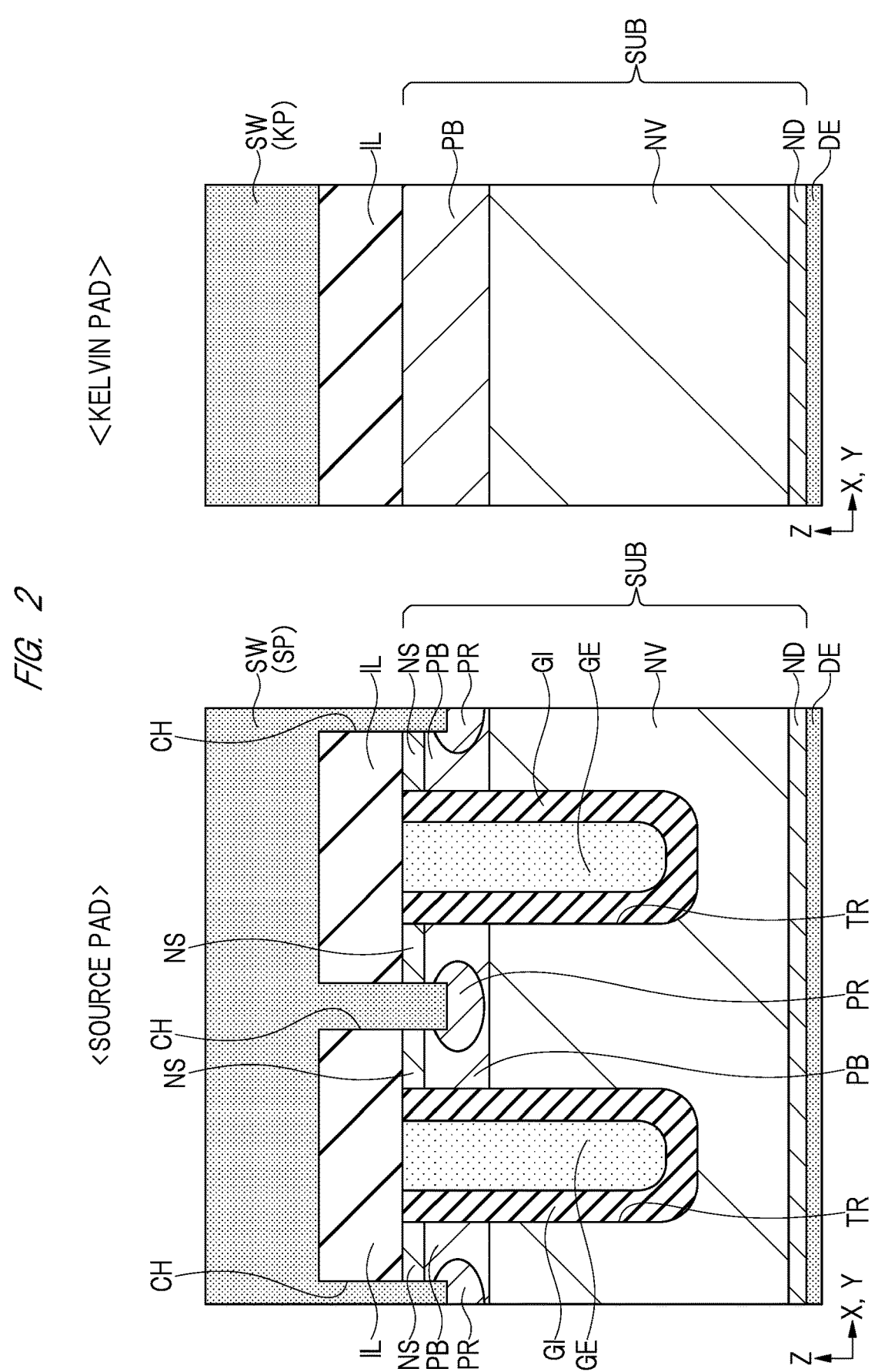
FIG. 2 is a cross-sectional view illustrating the semiconductor device according to the first embodiment.

As illustrated in FIG. 2, the kelvin pad KP is formed on the interlayer insulating film IL, and is a part of the same source wiring SW as the source pad SP. In the semiconductor substrate SUB under the kelvin pad KP, the MOSFET is not formed but the body region PB, the drift region NV, the drain region ND, and the drain electrode DE are formed. That is, the kelvin pad KP and the MOSFET do not overlap each other. The hole CH is not formed just under the kelvin pad KP, and the kelvin pad KP is not directly connected to the semiconductor substrate SUB.

Figure 3:
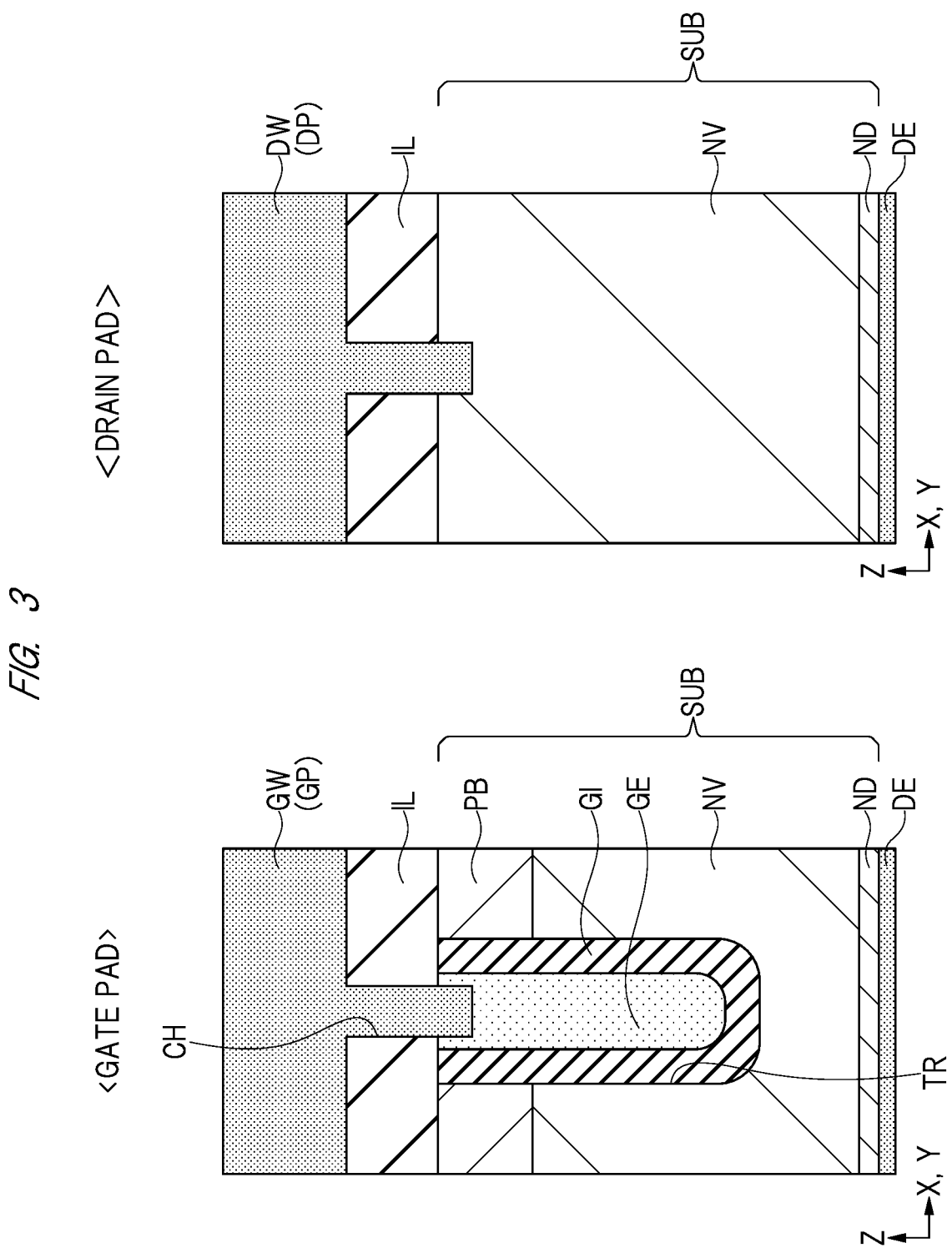
FIG. 3 is a cross-sectional view illustrating the semiconductor device according to the first embodiment.

As illustrated in FIG. 3, the gate wiring GW (the gate pad GP) is formed on the interlayer insulating film IL. In the semiconductor substrate SUB under the gate wiring GW, the MOSFET is not formed but a part of each of the trench TR, the gate insulating film GI, and the gate electrode GE is formed. That is, the gate wiring GW and the MOSFET do not overlap each other. The hole CH is formed in the interlayer insulating film IL to be positioned on the gate electrode GE. The gate wiring GW is embedded in the hole CH, is electrically connected to the gate electrode GE, and supplies a gate potential to the gate electrode GE.

As illustrated in FIG. 3, the drain wiring DW (the drain pad DP) is formed on the interlayer insulating film IL. In the semiconductor substrate SUB under the drain pad DP, neither the MOSFET nor a p-type impurity region such as the body region PB is formed. That is, the drain pad DP does not overlap the MOSFET and the body region PB. The hole CH is formed in the interlayer insulating film IL to be positioned on the drift region NV. The drain wiring DW is embedded in the hole CH, and is electrically connected to the semiconductor substrate SUB. Therefore, the drain wiring DW conducts with the drain electrode DE via the semiconductor substrate SUB (the drift region NV and the drain region ND).

As described below, each of the kelvin pad KP, the gate pad GP, and the drain pad DP is electrically connected to external electronic equipment such as another semiconductor chip or wiring substrate by a bonding wire. A predetermined signal can be transmitted to the external electronic equipment from the source region NS and the drain region ND via the kelvin pad KP and the drain pad DP.

The source wiring SW, the gate wiring GW, and the drain wiring DW are respectively formed in the same manufacturing steps, and are each formed of a barrier metal film and a conductive film formed on the barrier metal film. The barrier metal film is, for example, a titanium nitride film, and the conductive film is, for example, an aluminum film. The thickness of each of the source wiring SW, the gate wiring GW, and the drain wiring DW is, for example, 2 μm or more and 6 μm or less.

Figure 4:
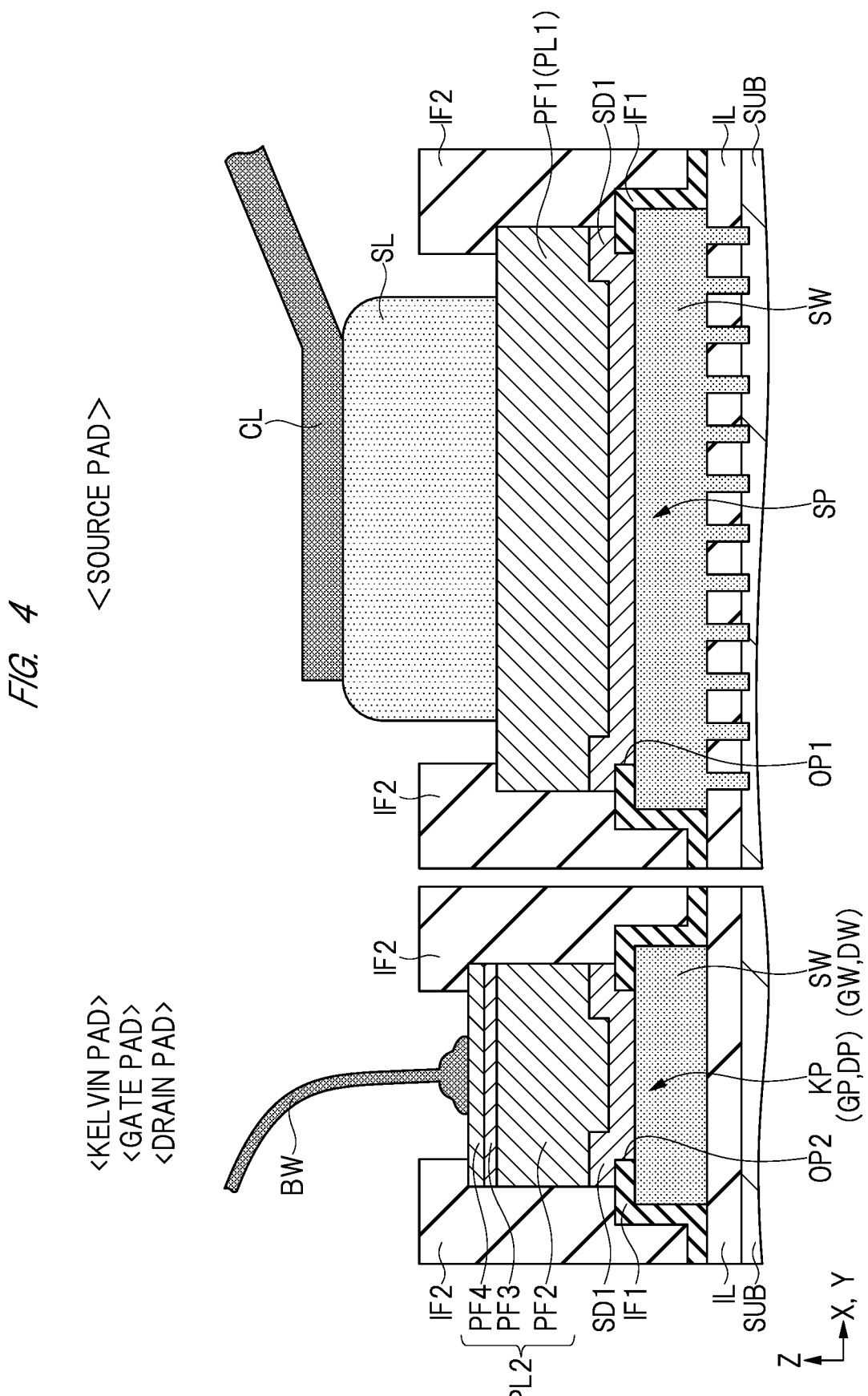
FIG. 4 is a cross-sectional view illustrating the semiconductor device according to the first embodiment.

FIG. 4 is a cross-sectional view illustrating a state of electrical connection among the source pad SP, the kelvin pad KP, the gate pad GP, and the drain pad DP, and a clip CL and the bonding wire BW as external connection members. A seed layer SD1 and each of a plating layer PL1 and a plating layer PL2 formed as an OPM electrode are applied to such connection. Note that respective structures of the OPM electrodes formed on the kelvin pad KP, the gate pad GP, and the drain pad DP are the same. Accordingly, the kelvin pad KP is hereinafter described as a main typical example.

As illustrated in FIG. 4, an insulating film IF1 is formed on the interlayer insulating film IL to cover the source wiring SW, the gate wiring GW, and the drain wiring DW. The insulating film IF1 is, for example, a silicon oxynitride film or a silicon nitride film. Note that the insulating film IF1 may be a stacked film of a silicon oxide film and a silicon oxynitride film or a silicon nitride film formed on the silicon oxide film.

The opening OP1 and the plurality of openings OP2 are formed in the insulating film IF1. Parts of wirings exposed in the openings respectively configure the pads as described in FIG. 1.

The seed layer SD1 is formed on the source pad SP. The seed layer SD1 is, for example, a stacked film of chromium (Cr) and copper (Cu). The thickness of the seed layer SD1 is, for example, 1 μm or more and 2 μm or less.

The plating layer PL1 is formed on the seed layer SD1. A material of an uppermost surface of the plating layer PL1 is a metal other than a noble metal. The plating layer PL1 in the first embodiment includes a plating film PF1. The plating film PF1 described here configures the uppermost surface of the plating layer PL1. A material forming the plating film PF1 is, for example, copper (Cu). The thickness of the plating film PF1 is, for example, 10 μm or more and 20 μm or less.

An insulating film IF2 is formed on the plating film PF1 to cover the outer periphery of the plating film PF1. The insulating film IF2 is, for example, a resin film such as a polyimide film. The external connection member is formed on the plating film PF1 exposed in the insulating film IF2.

The plane area of each of the source pad SP and the plating film PF1 is sufficiently larger than the plane areas of the other pad and a plating film PF4. Therefore, a solder layer SL is formed on the plating film PF1, and the clip CL is formed on the solder layer SL. The clip CL is a metal plate such as a copper plate. The thickness of the solder layer SL is, for example, 100 μm or more and 200 μm or less. The source pad SP is electrically connected to external electronic equipment such as another semiconductor chip or wiring substrate via the solder layer SL and the clip CL.

The seed layer SD1 is formed on each of the kelvin pad KP, the gate pad GP, and the drain pad DP. The plating layer PL2 is formed on the seed layer SD1. A material of an uppermost surface of the plating layer PL2 is a noble metal. The plating layer PL2 in the first embodiment includes a plating film PF2, a plating film PF3 and a plating film PF4. The plating film PF4 configures the uppermost surface of the plating layer PL2 in this case.

The plating film PF2 is formed by the same manufacturing step as that of the plating film PF1. Therefore, a material forming the plating film PF2 is the same as a material such as copper (Cu) forming the plating film PF1. The thickness of the plating film PF2 is, for example, 10 μm or more and 20 μm or less. A material forming the plating film PF3 is a noble metal such as palladium (Pd). A material forming the plating film PF4 is a noble metal such as gold (Au). The thickness of each of the plating film PF3 and the plating film PF4 is smaller than the thickness of the plating film PF2, and is, for example, 1 μm or more and 3 μm or less.

The "noble metal" described in the present application means an element that is difficult to form a compound and has rarity. The "noble metal" can also be referred to as an element having a single electrode potential that is equal to or higher than a single electrode potential of silver (Ag). Specifically, the "noble metal" is gold (Au), silver (Ag), platinum (Pt), palladium (Pd), rhodium (Rh), iridium (Ir), ruthenium (Ru), or osmium (Os).

The insulating film IF2 is formed on the plating film PF4 to cover the outer periphery of the plating film PF4. The external connection member is formed on the plating film PF4 exposed in the insulating film IF2.

The plane area of each of the kelvin pad KP, the gate pad GP, and the drain pad DP is smaller than the plane area of the source pad SP. The plane area of each of the plating films PF4 is smaller than the plane area of the plating film PF1. Therefore, since the clip CL is difficult to be connected onto the plating film PF4 via the solder layer SL, the bonding wire BW is formed. A material forming the bonding wire BW is, for example, gold (Au) or copper (Cu). Each of the kelvin pad KP, the gate pad GP, and the drain pad DP is electrically connected to external electronic equipment such as another semiconductor chip or wiring substrate via the bonding wire BW.

To improve adhesion to the bonding wire BW and to prevent a surface of the plating layer PL2 from being oxidized, the plating film PF4 is applied to the uppermost surface of the plating layer PL2. To suppress a stress at the time of bonding of the bonding wire BW, the thickness of the plating film PF2 is made sufficiently large. Copper forming the plating film PF2 may be diffused to a surface of the plating film PF4. To prevent the copper from being diffused, the plating film PF3 is provided.

Note that the plating film PF1 on the source pad SP is also formed of copper. Accordingly, a natural oxide may be formed on a surface of the plating film PF1 (a surface of the plating layer PL1). However, when the solder layer SL is formed, flux process is performed to the surface of the plating film PF1. Thus, the above-described natural oxide is removed by a reduction reaction that occurs in the case. Therefore, the plating film PF1 and the solder layer SL are favorably connected to each other.

Thus, in the first embodiment, a plating film formed of a noble metal is not formed on the source pad SP having a large area. Therefore, an increase in manufacturing cost can be suppressed.

The plating films PF1 to PF4 are formed by an electrolytic plating method in the first embodiment as described later in a section "METHOD OF MANUFACTURING SEMICON-DUCTOR DEVICE". As described in the foregoing problem, the use of the electroless plating method causes the problem that is easiness of the non-adhesion of the gold film particularly in the kelvin pad KP and the drain pad DP. Therefore, a malfunction such as defective bonding tends to occur at the time of connection to the bonding wire BW. Accordingly, there has been a problem of a decrease in yield. By the plating films PF1 to PF4 in the first embodiment, the problems can be solved, and therefore, the reliability of the semiconductor device 100 can be improved, and the increase in manufacturing cost can be suppressed.

Method of Manufacturing Semiconductor Device

Each of manufacturing steps included in a method of manufacturing the semiconductor device 100 according to the first embodiment will be described below with reference to FIGS. 5 to 11. Main features of the present application are each of pads and a structure above the pads. Accordingly, in FIGS. 5 to 11, respective steps of manufacturing the structures will be described. Before describing the manufacturing step illustrated in FIG. 5, a manufacturing step of a MOS-FET and a manufacturing step of a structure under each of the pads will be briefly described with reference to FIGS. 2 and 3.

First, an n-type semiconductor substrate SUB having an upper surface and a lower surface is prepared. Then, on the upper surface of the semiconductor substrate SUB, the trench TR is formed in the semiconductor substrate SUB by a photolithography technique and an etching process. Then, the gate insulating film GI is formed in the trench TR by, for example, a thermal oxidation method or a CVD method.

Then, for example, an n-type polycrystalline silicon film is formed on the gate insulating film GI to fill the trench TR by, for example, a CVD method. Then, an anisotropic etching process is performed to remove the polycrystalline silicon film formed outside the trench TR. Thus, a gate electrode GE is formed to fill the trench TR.

Then, the upper surface of the semiconductor substrate SUB is doped with, for example, boron (B) by a photolithography technique and an ion implantation method to selectively form the p-type body region PB in the semiconductor substrate SUB. Then, the upper surface of the semiconductor substrate SUB is doped with, for example, arsenic (As) by a photolithography technique and an ion implantation method to selectively form the n-type source region NS in the body region PB.

Then, the interlayer insulating film IL is formed on the upper surface of the semiconductor substrate SUB to cover the trench TR by, for example, a CVD method. Then, a plurality of the holes CH is formed in the interlayer insulating film IL by a photolithography technique and an anisotropic etching process. In a region where the source wiring SW is formed, the plurality of holes CH is formed to reach the source region NS and the body region PB. Then, the upper surface of the semiconductor substrate SUB is doped with, for example, boron (B) by an ion implantation method to form a p-type high-concentration diffusion region PR in the body region PB in a bottom portion of each of the holes CH.

In a region where the gate wiring GW is formed, the plurality of holes CH is formed to reach the gate electrode GE. In a region where the drain wiring DW is formed, the plurality of holes CH is formed to reach the semiconductor substrate SUB (the drift region NV).

Then, the source wiring SW, the gate wiring GW, and the drain wiring DW are formed on the interlayer insulating film IL. First, on the interlayer insulating film IL, a stacked film of a barrier metal film formed of, for example, a titanium nitride film and a conductive film formed of, for example, an aluminum film is formed by a sputtering method or a CVD method. Then, the stacked film is patterned to form the source wiring SW, the gate wiring GW, and the drain wiring DW.

The source wiring SW is embedded in the holes CH, and is electrically connected to the source region NS, the body region PB, and the high-concentration diffusion region PR. The gate wiring GW is embedded in the hole CH, and is electrically connected to the gate electrode GE. The drain wiring DW is embedded in the holes CH, and is electrically connected to the drift region NV and the drain region ND formed after that. Then, the lower surface of the semiconductor substrate SUB is doped with, for example, arsenic (As) by an ion implantation method to form the n-type drain region ND in the semiconductor substrate SUB. Then, the drain electrode DE is formed on the lower surface of the semiconductor substrate SUB by a sputtering method.

Manufacturing steps subsequent to the step of FIG. 5 will be described below.

Figure 5:
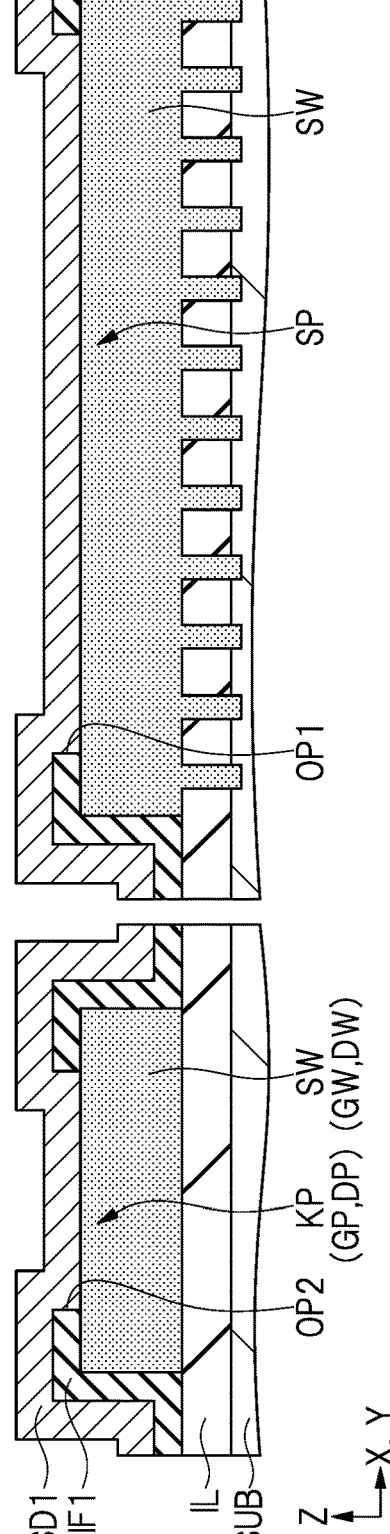
FIG. 5 is a cross-sectional view illustrating a manufacturing step of the semiconductor device according to the first embodiment.

As illustrated in FIG. 5, an insulating film IF1 is first formed on the interlayer insulating film IL by, for example, a CVD method to cover the source wiring SW, the gate wiring GW, and the drain wiring DW. Then, the opening OP1 and the plurality of openings OP2 are formed in the insulating film IF1 by a photolithography technique and an anisotropic etching process to expose a part of each of the source wiring SW, the gate wiring GW, and the drain wiring DW. Parts of the wirings exposed in the openings respectively configure pads, as described in FIG. 1.

Then, the seed layer SD1 is formed on the source pad SP, the kelvin pad KP, the gate pad GP, and the drain pad DP and the insulating film IF1 by a sputtering method. The seed layer SD1 is, for example, a stacked film of chromium (Cr) and copper (Cu).

Figure 6:
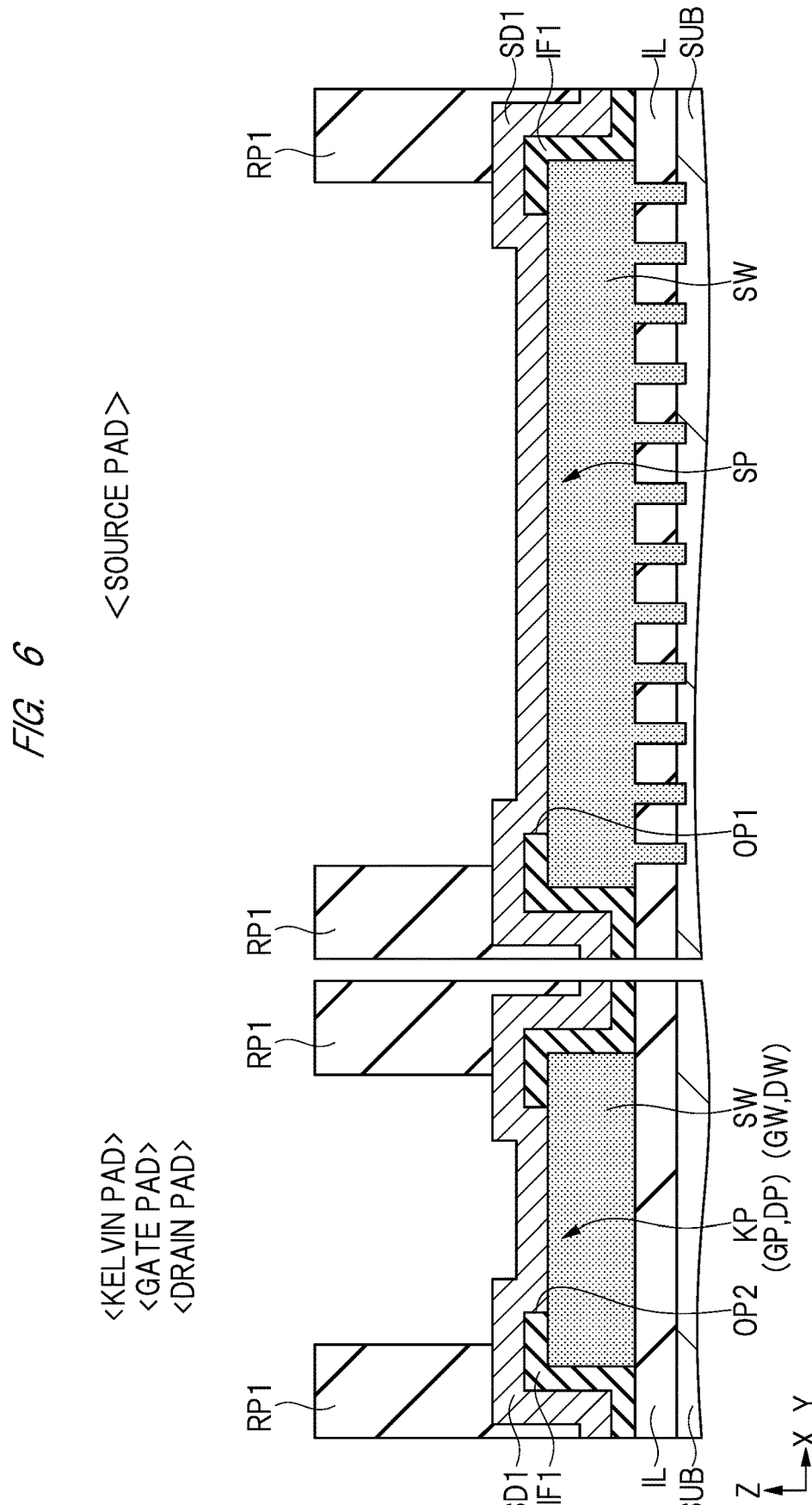
FIG. 6 is a cross-sectional view illustrating a manufacturing step continued from FIG. 5.

As illustrated in FIG. 6, a resist pattern RP1 having a pattern that opens an upper part of each of the source pad SP, the kelvin pad KP, the gate pad GP, and the drain pad DP is formed on the seed layer SD1.

Figure 7:
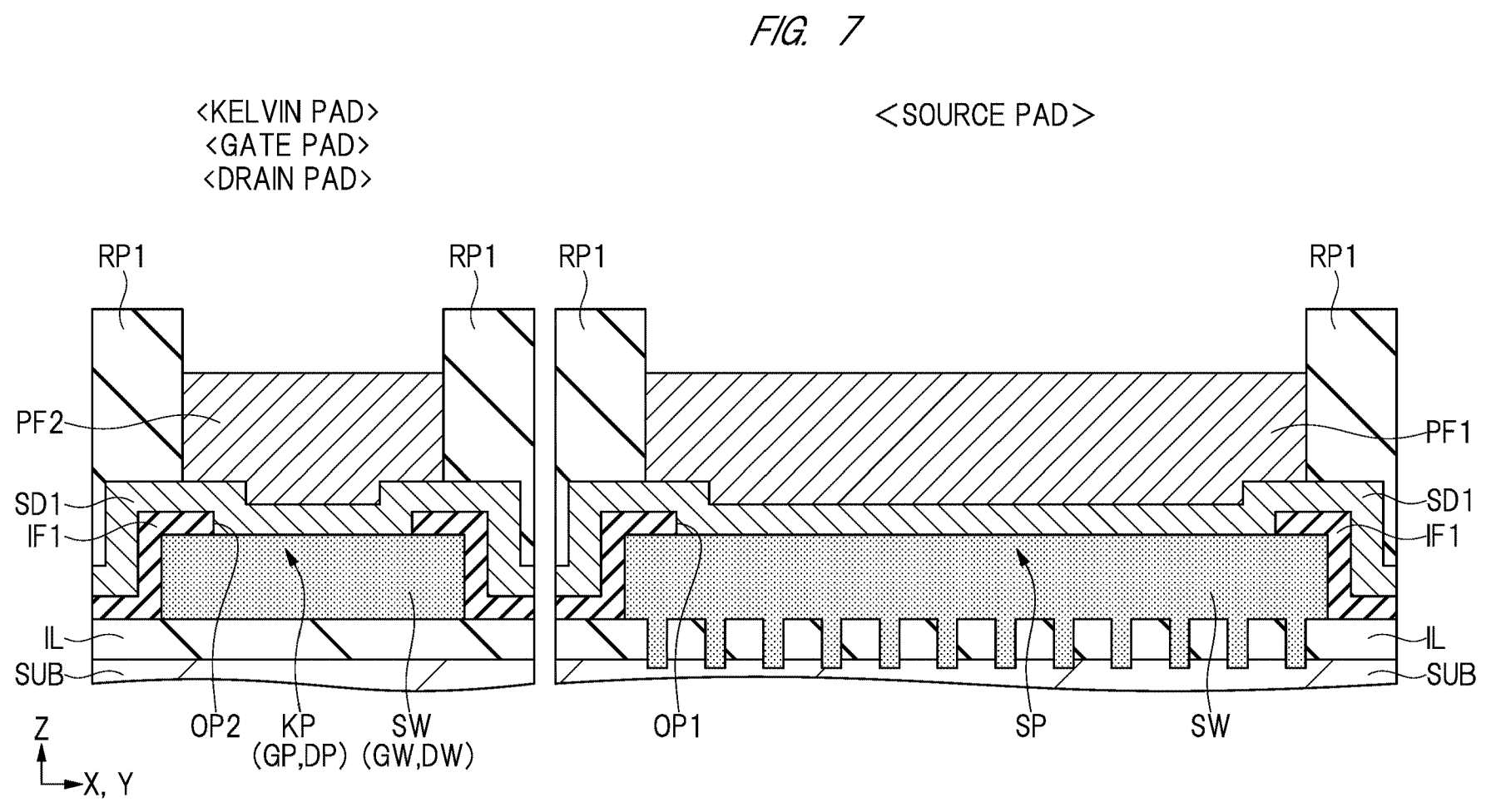

As illustrated in FIG. 7, by an electrolytic plating method, a plating film PF1 is formed on the seed layer SD1 on the source pad SP, and a plating film PF2 is formed on the seed layer SD1 on each of the kelvin pad KP, the gate pad GP, and the drain pad DP. A material forming each of the plating film PF1 and the plating film PF2 is, for example, copper (Cu). Then, the resist pattern RP1 is removed by asking process.

Figure 8:
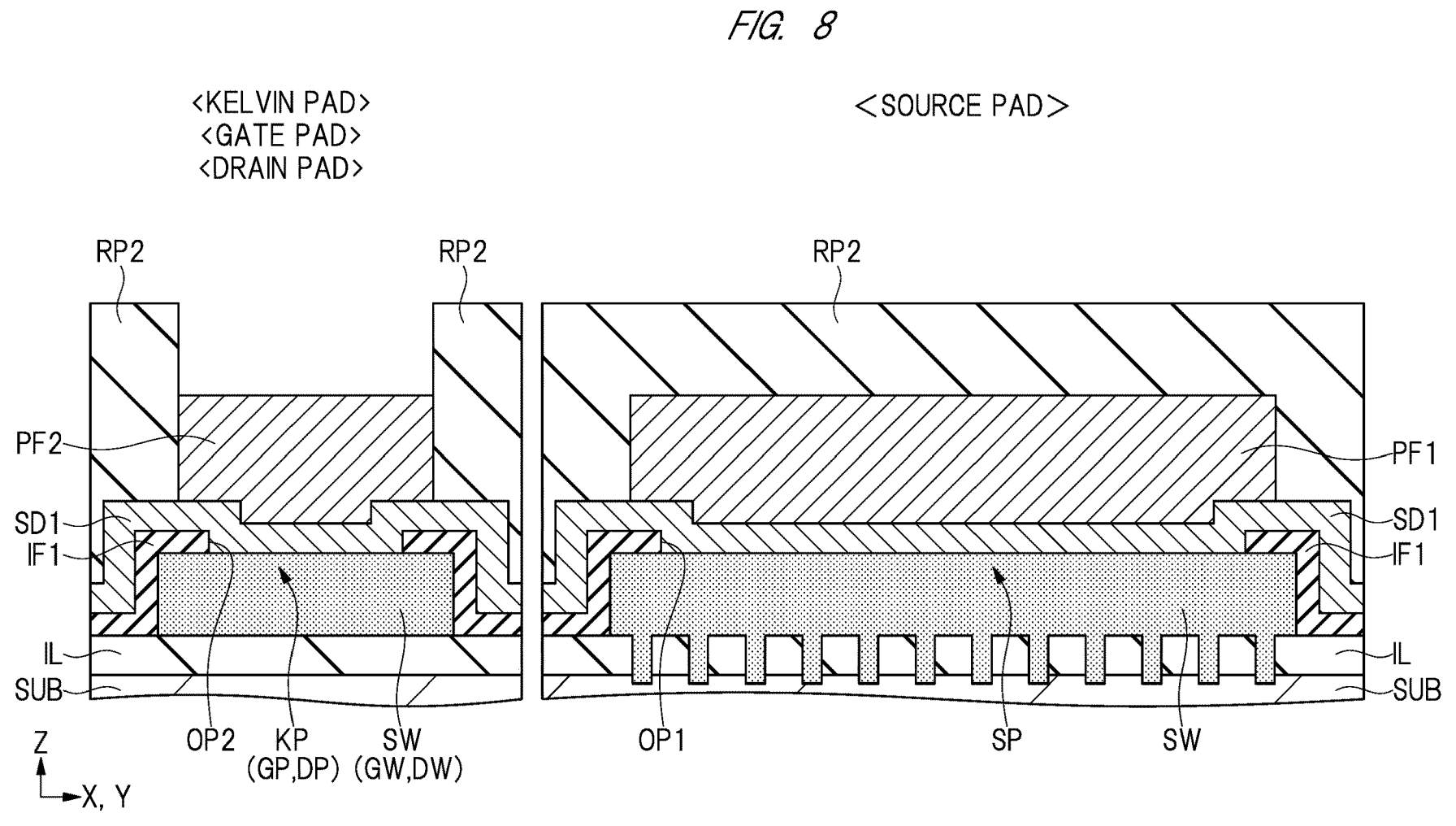

As illustrated in FIG. 8, a resist pattern RP2 having a pattern that covers the plating film PF1 and opens the plating film PF2 on each of the kelvin pad KP, the gate pad GP, and the drain pad DP is formed.

Figure 9:
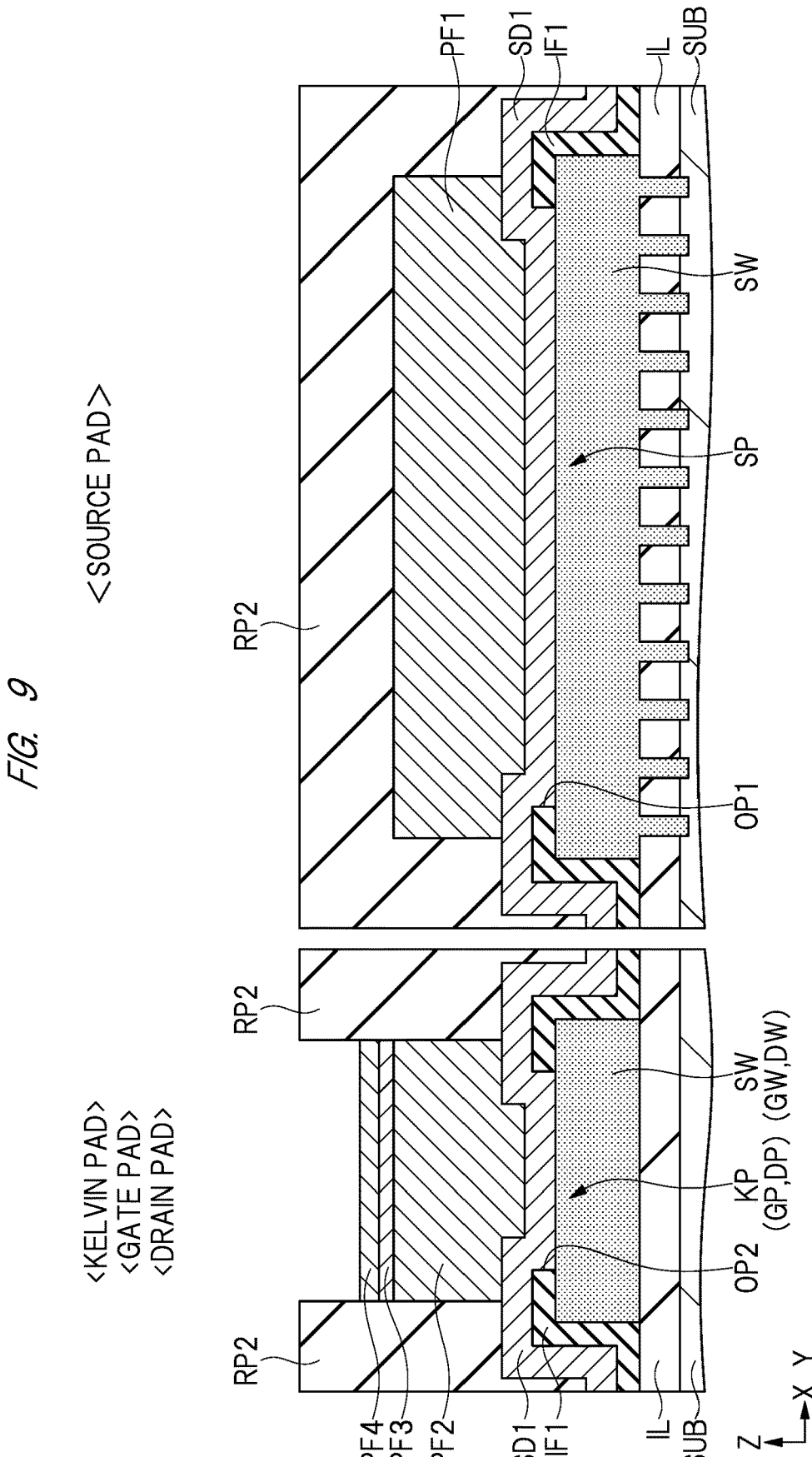
FIG. 9 is a cross-sectional view illustrating a manufacturing step continued from FIG. 8.

As illustrated in FIG. 9, a plating film PF3 is formed on each of the plating films PF2 by an electrolytic plating method. Then, a plating film PF4 is formed on each of the plating films PF3 by an electrolytic plating method. A material forming the plating film PF3 is a noble metal such as palladium (Pd). A material forming the plating film PF4 is a noble metal such as gold (Au). Then, the resist pattern RP2 is removed by asking process. In the manner, the plating layer PL1 including the plating film PF1 is formed on the source pad SP, and the plating layer PL2 including the plating film PF2, the plating film PF3, and the plating film PF4 is formed on each of the kelvin pad KP, the gate pad GP, and the drain pad DP.

Figure 10:
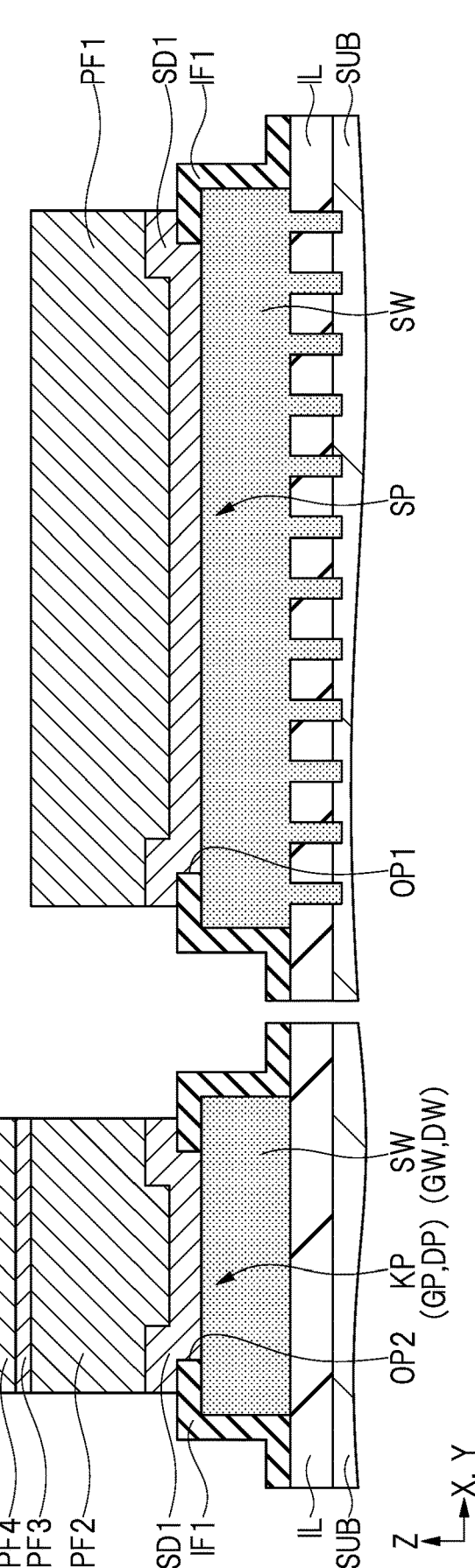
FIG. 10 is a cross-sectional view illustrating a manufacturing step continued from FIG. 9.

As illustrated in FIG. 10, the seed layer SD1 exposed in the plating films PF1 to PF4 is removed by wet etching process.

Figure 11:
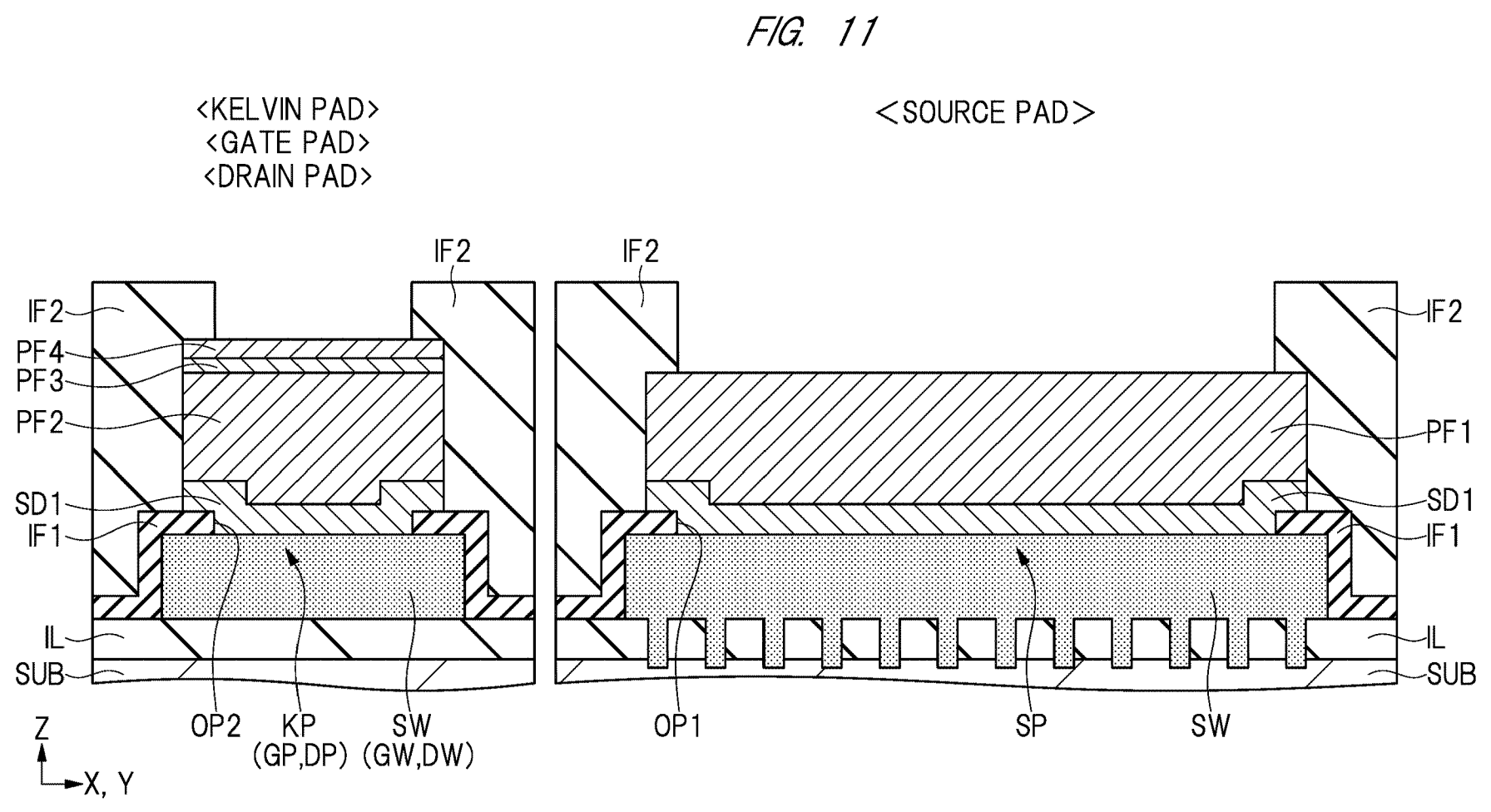

As illustrated in FIG. 11, the insulating film IF2 formed of, for example, a polyimide film is first formed by a coating method to cover the plating film PF1 and the plating film PF4. Then, a part of the insulating film IF2 is opened such that the insulating film IF2 is left on the outer periphery of each of the plating film PF1 and the plating film PF4.

Then, a structure illustrated in FIG. 4 is obtained through the following manufacturing steps.

First, a flux process is performed to a surface of the plating film PF1 exposed in the insulating film IF2. A film such as the plating film PF4 for preventing oxidation is not formed on the surface of the plating film PF1. Accordingly, a natural oxide may be formed on the surface of the plating film PF1. The natural oxide is removed by a reduction reaction of the flux process. Wettability of a solder is improved by the flux process. Then, by reflow process after printing of a solder paste on the plating film PF1, the solder layer SL is formed on the plating film PF1. Then, the clip CL is connected onto the solder layer SL.

Then, the bonding wire BW is connected onto the plating film PF4. The bonding wire BW is formed of, for example, gold (Au) or copper (Cu). The semiconductor device 100 is electrically connected to external electronic equipment such as another semiconductor chip or wiring substrate by the external connection members such as the bonding wire BW and the clip CL. Note that either one of a manufacturing step of the bonding wire BW and a manufacturing step of the solder layer SL and the clip CL is fine to be performed first.

Second Embodiment

A semiconductor device according to a second embodiment will be described below with reference to FIG. 12. In the following description, a difference from the first embodiment is mainly described, and description of the same points as those in the first embodiment is omitted.

In the second embodiment, respective configurations of a seed layer SD2 and the plating layer PL2 differ from those in the first embodiment.

A material forming the seed layer SD2 is, for example, palladium (Pd). The thickness of the seed layer SD2 is, for example, 1 μm or more and 2 μm or less. The similar plating layer PL1 (plating film PF1) to that in the first embodiment is formed on the seed layer SD2 on the source pad SP.

The plating layer PL2 is formed on the seed layer SD2 on each of the kelvin pad KP, the gate pad GP, and the drain pad DP. A material of an uppermost surface of the plating layer PL2 is a noble metal. The plating layer PL2 in the second embodiment includes a plating film PF3 and a plating film PF4. The plating film PF4 described here configures the uppermost surface of the plating layer PL2.

Even in the second embodiment, a material forming the plating film PF3 is a noble metal such as palladium (Pd). A material forming the plating film PF4 is a noble metal such as gold (Au).

In the second embodiment, a plating film formed of a noble metal is not formed either on the source pad SP having a large area, and therefore, the increase in manufacturing cost is suppressed. Even in the second embodiment, the plating film PF3 and the plating film PF4 are formed by an electrolytic plating method. Therefore, the problem that is easiness of the non-adhesion of the gold film particularly in the kelvin pad KP and the drain pad DP can be suppressed, and the reliability of the semiconductor device 100 can be improved.

The second embodiment is different from the first embodiment in that the plating layer PL2 does not include the plating film PF2 formed of copper (Cu). When the plating film PF3 is formed by an electrolytic plating method, a palladium plating solution (Pd plating solution) is used. However, when a plating film PF2 formed of copper is exposed as a base, the Pd plating solution may be contaminated by copper. Accordingly, it is necessary to purify the Pd plating solution before use of the Pd plating solution, and this becomes a factor of delay in manufacture. Therefore, in the second embodiment, the plating film PF3 formed of palladium is directly formed on the seed layer SD2.

On the other hand, in the first embodiment, the plating film PF2 acts to suppress the stress at the time of bonding of the bonding wire BW. Therefore, the first embodiment is superior to the second embodiment in terms of reducing the stress. However, according to the studies by the inventors of the present application, if the thickness of the plating film PF4 is sufficiently large, impact of the bonding wire BW can be absorbed by the plating film PF4. The thickness of the plating film PF4 is, for example, 3 μm or more. The thickness of the plating film PF3 is, for example, also 3 μm or more.

Method of Manufacturing Semiconductor Device According to Second Embodiment

Each of manufacturing steps included in a method of manufacturing the semiconductor device 100 according to the second embodiment will be described below with reference to FIGS. 13 to 19. The manufacturing steps in the second embodiment are the same as the manufacturing steps in the first embodiment up to the manufacturing step of the insulating film IF1, the opening OP1, and the openings OP2 illustrated in FIG. 5.

Figure 13:
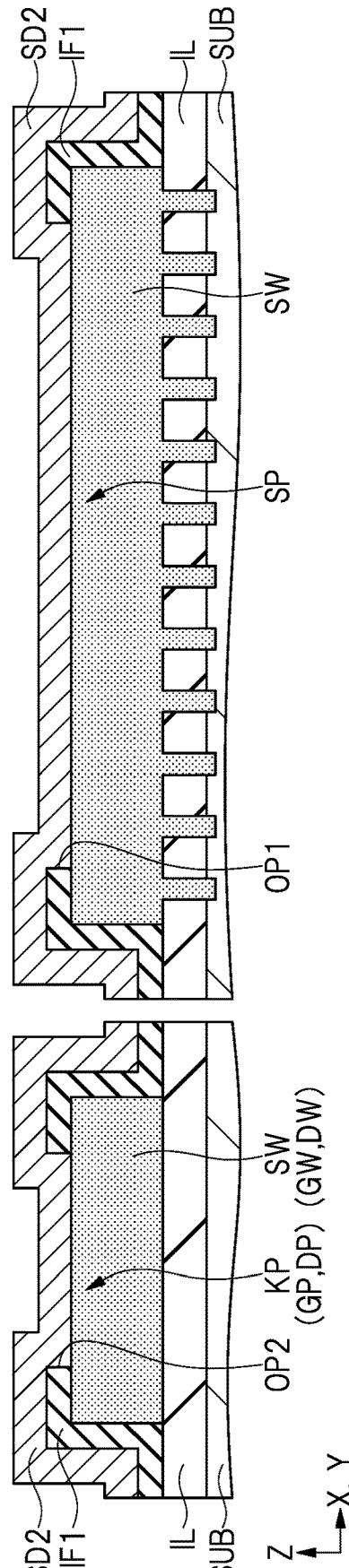
FIG. 13 is a cross-sectional view illustrating a manufacturing step of the semiconductor device according to the second embodiment.

As illustrated in FIG. 13, the seed layer SD2 is formed on the source pad SP, the kelvin pad KP, the gate pad GP, the drain pad DP, and an insulating film IF1 by a sputtering method. The seed layer SD2 is formed of, for example, palladium (Pd).

Figure 14:
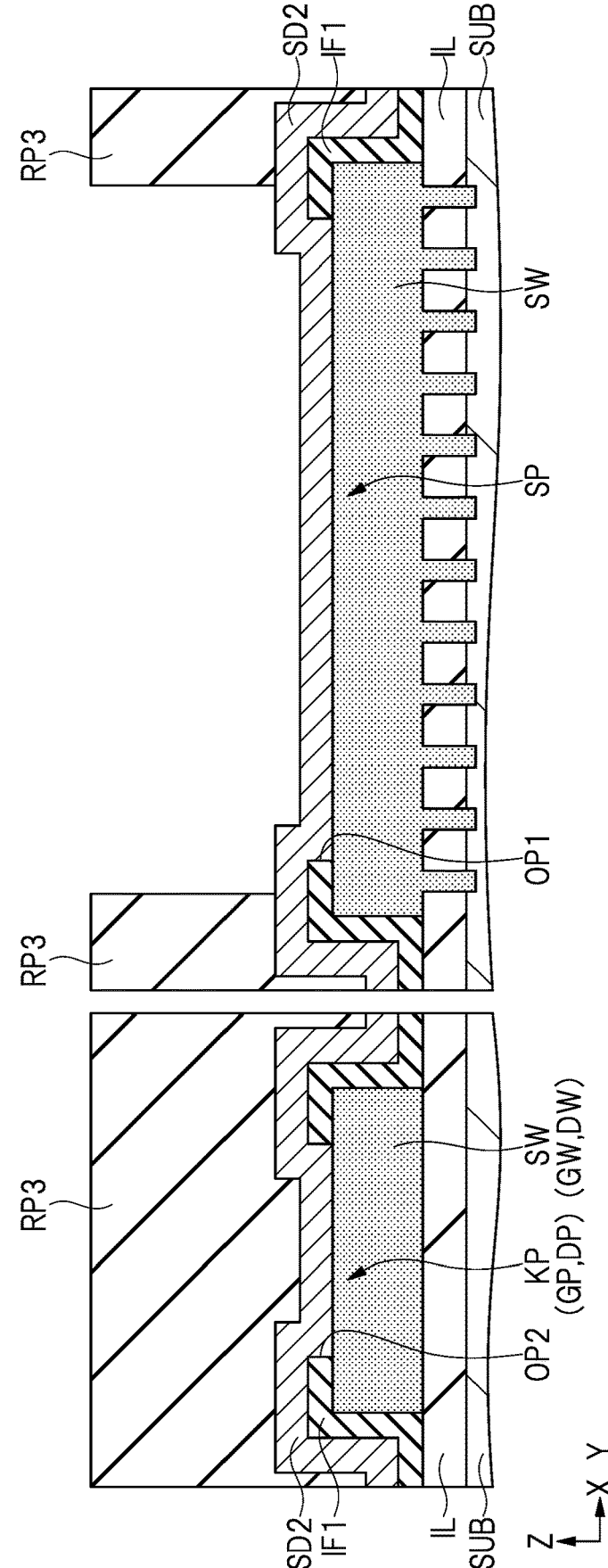
FIG. 14 is a cross-sectional view illustrating a manufacturing step continued from FIG. 13.

As illustrated in FIG. 14, a resist pattern RP3 having a pattern that covers the seed layer SD2 on each of the kelvin pad KP, the gate pad GP, and the drain pad DP and opens the seed layer SD2 on the source pad SP is formed.

Figure 15:
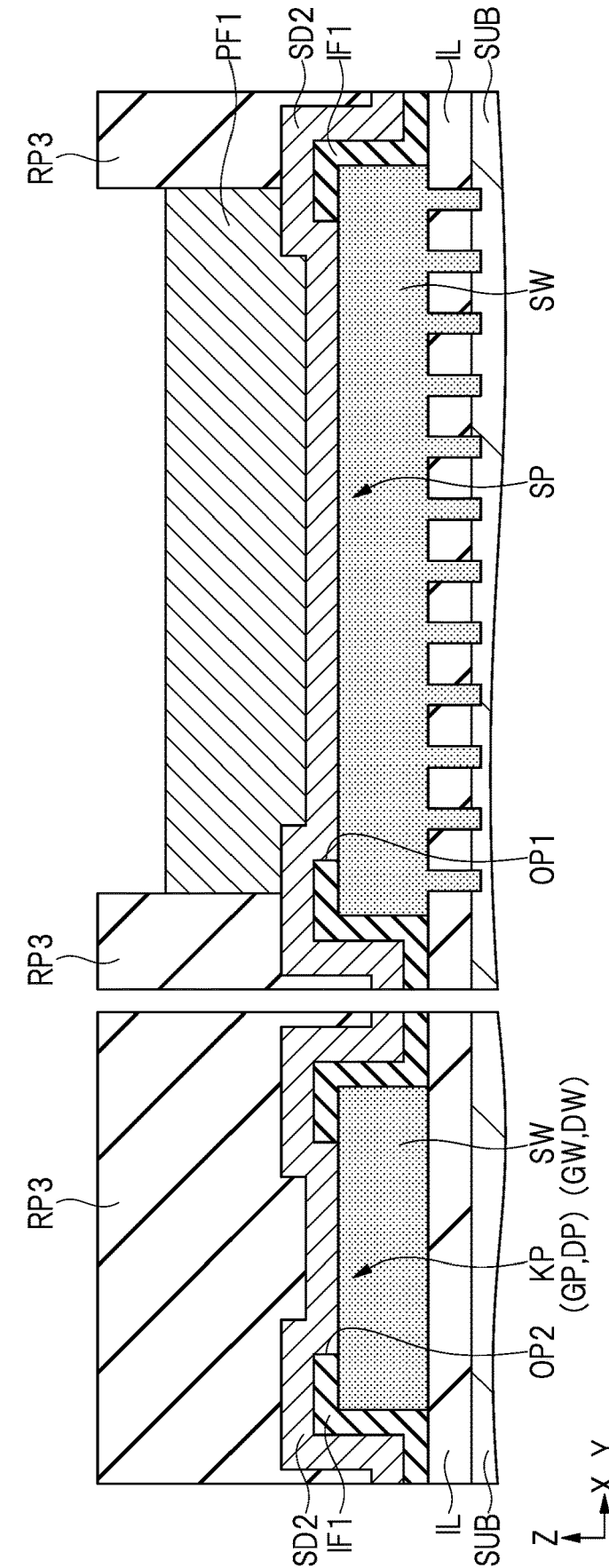
FIG. 15 is a cross-sectional view illustrating a manufacturing step continued from FIG. 14.

As illustrated in FIG. 15, a plating film PF1 is formed on the seed layer SD2 on the source pad SP by an electrolytic plating method. A material forming the plating film PF1 is, for example, copper (Cu). Then, the resist pattern RP3 is removed by asking process.

Figure 16:
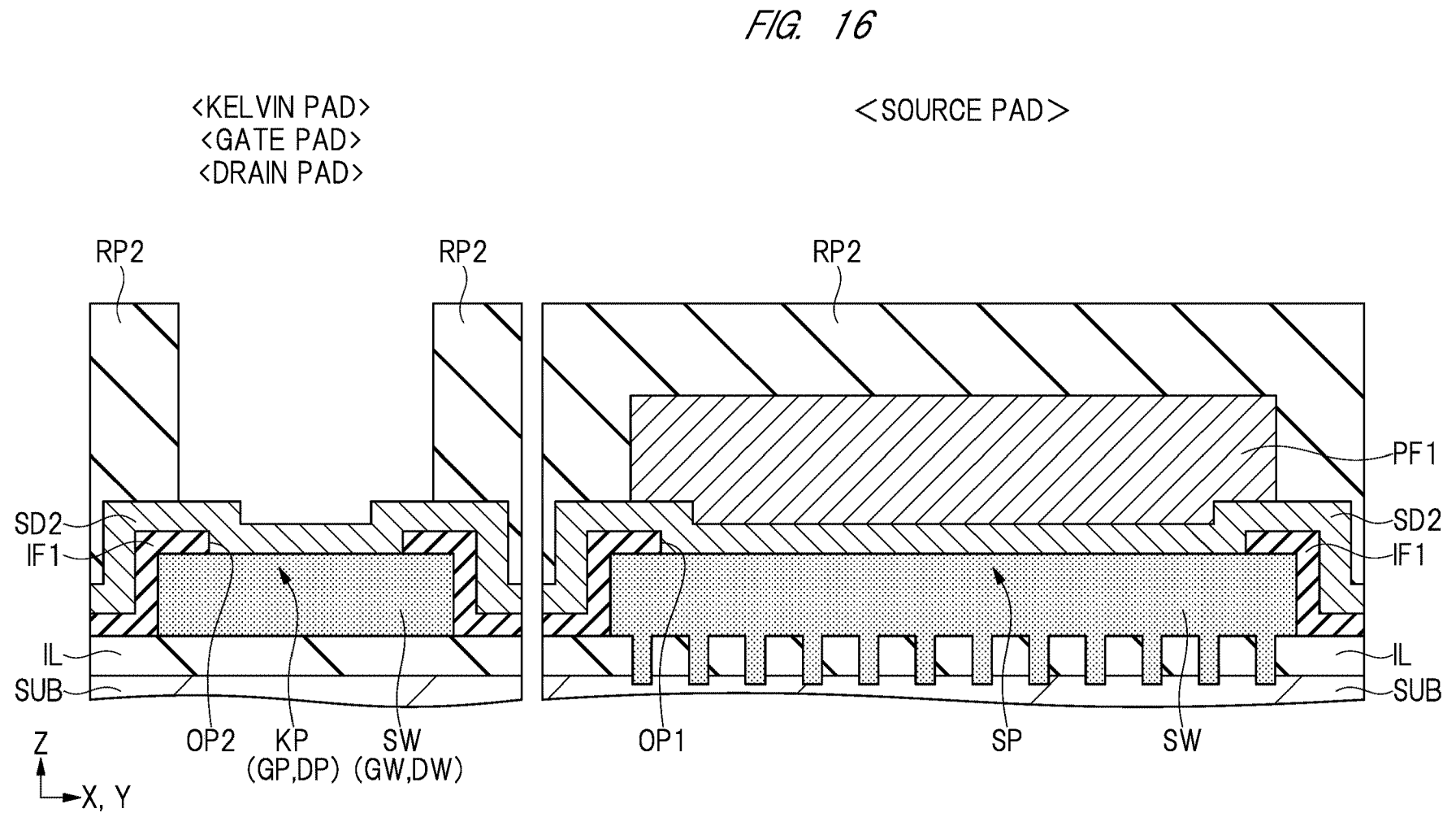

As illustrated in FIG. 16, a resist pattern RP2 having a pattern that covers the plating film PF1 and opens the seed layer SD2 on each of the kelvin pad KP, the gate pad GP, and the drain pad DP is formed.

As illustrated in FIG. 17, a plating film PF3 is formed on each seed layer SD2 by an electrolytic plating method. Then, a plating film PF4 is formed on each plating film PF3 by an electrolytic plating method. A material forming the plating film PF3 is a noble metal such as palladium (Pd). A material forming the plating film PF4 is a noble metal such as gold (Au). Then, the resist pattern RP2 is removed by asking process. In the manner, the plating layer PL1 including the plating film PF1 is formed on the source pad SP, and the plating layer PL2 including the plating film PF3 and the plating film PF4 is formed on each of the kelvin pad KP, the gate pad GP, and the drain pad DP.

Figure 18:
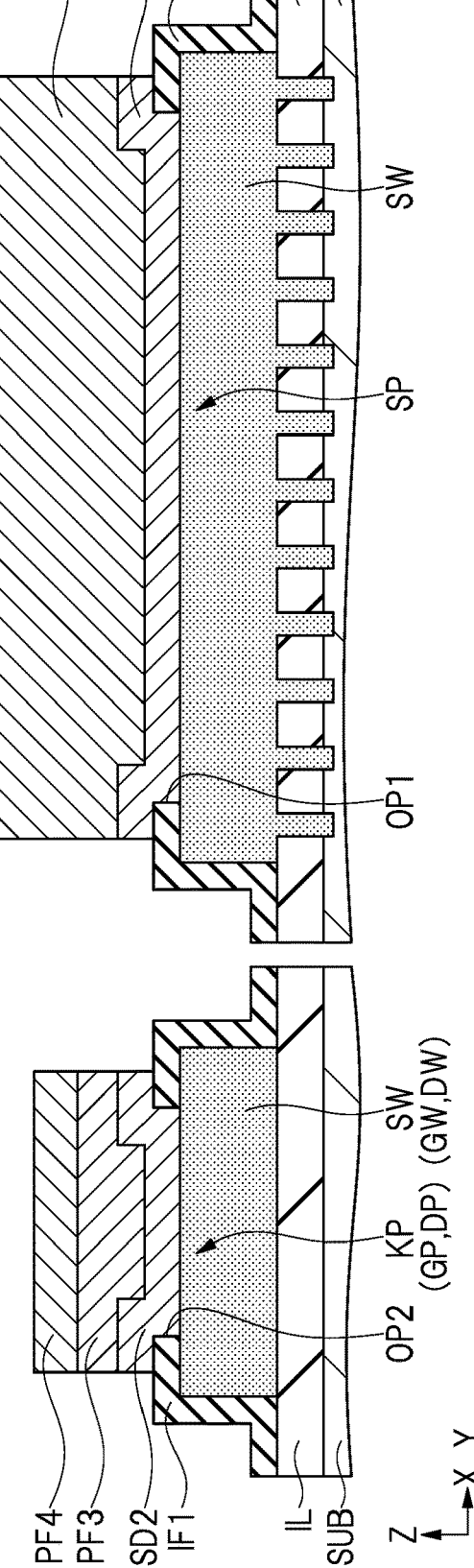
FIG. 18 is a cross-sectional view illustrating a manufacturing step continued from FIG. 17.

As illustrated in FIG. 18, the seed layer SD2 exposed in the plating film PF1, the plating film PF3, and the plating film PF4 is removed by a wet etching process.

Figure 19:
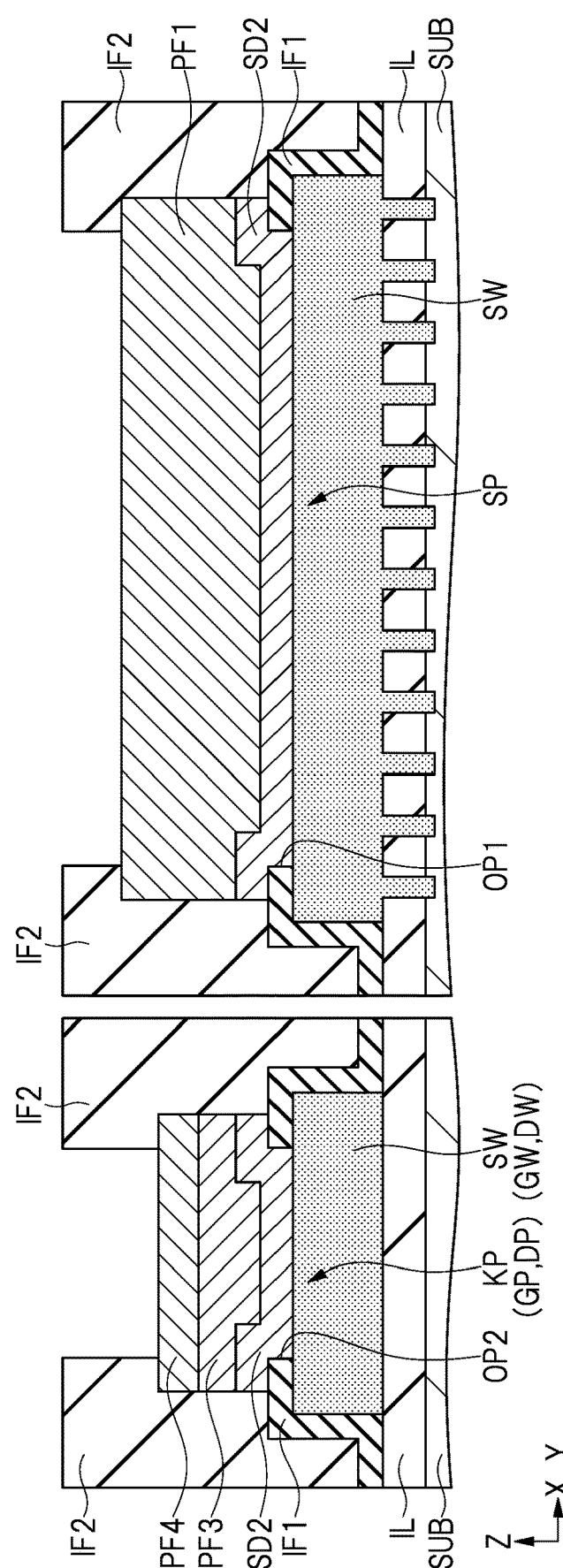
FIG. 19 is a cross-sectional view illustrating a manufacturing step continued from FIG. 18.

As illustrated in FIG. 19, the insulating film IF2 formed of, for example, a polyimide film is first formed by a coating method to cover the plating film PF1 and the plating film PF4. Then, a part of the insulating film IF2 is opened such that the insulating film IF2 is left on the outer periphery of each of the plating film PF1 and the plating film PF4.

Figure 12:
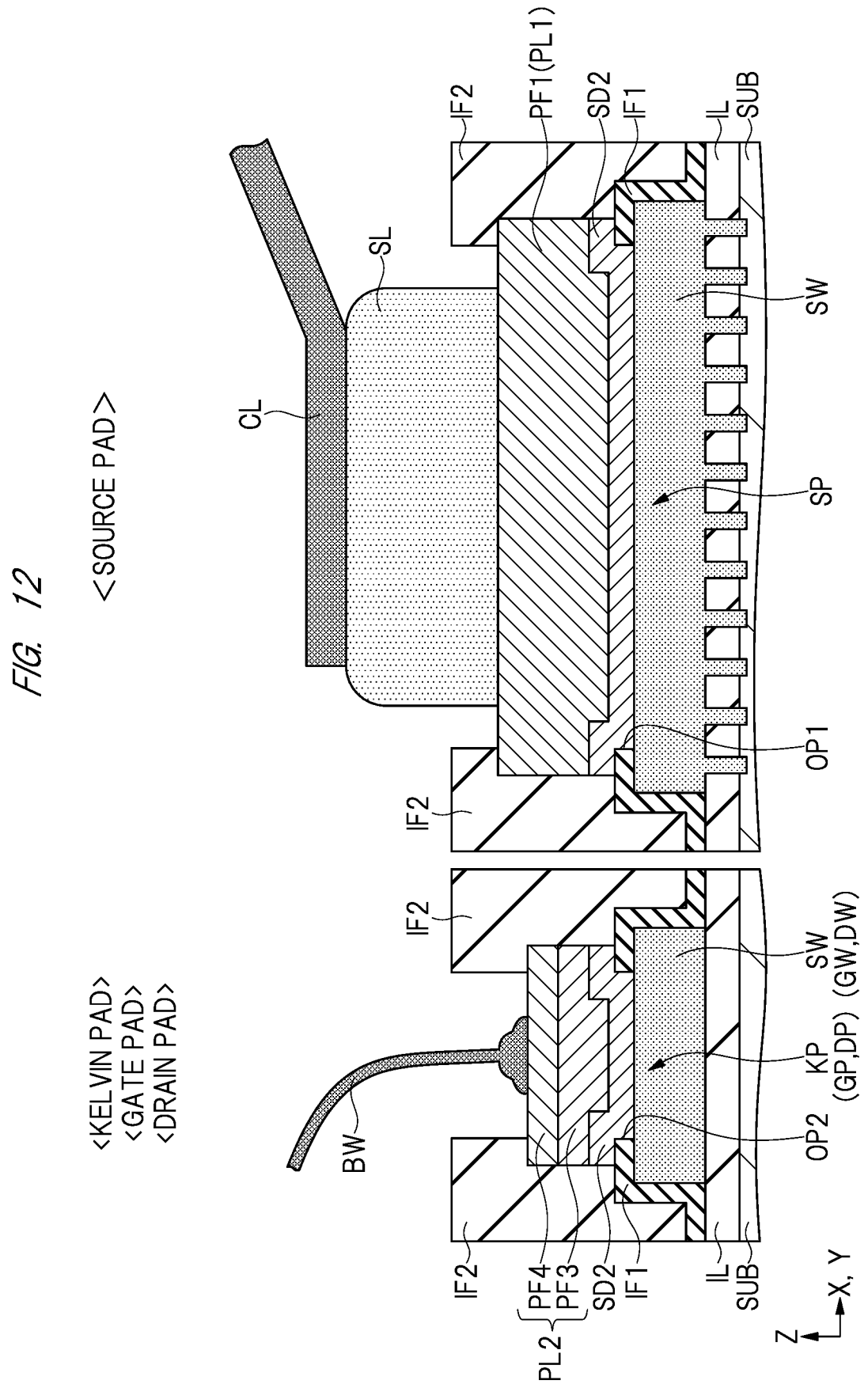
FIG. 12 is a cross-sectional view illustrating a semiconductor device according to a second embodiment.

Then, a structure illustrated in FIG. 12 is obtained by a similar method to that in the first embodiment to form the solder layer SL, the clip CL, and the bonding wire BW.

In the foregoing, the present invention has been concretely described on the basis of the embodiments. However, the present invention is not limited to the foregoing embodiments, and various modifications can be made within the scope of the present invention.

What is claimed is:

1. A method of manufacturing a semiconductor device, the method comprising:

(a) preparing a semiconductor substrate having an upper surface;

(b) forming an interlayer insulating film on the upper surface of the semiconductor substrate;

(c) forming a first pad and a second pad having a smaller plane area than a plane area of the first pad on the interlayer insulating film;

(d) forming a seed layer on the first pad and the second pad by a sputtering method;

(e) forming a first plating film on the seed layer on the first pad and forming a second plating film on the seed layer on the second pad by an electrolytic plating method;

(f) forming a third plating film on the second plating film by an electrolytic plating method; and (g) forming a fourth plating film on the third plating film by an electrolytic plating method, wherein a material forming the third plating film differs from a material forming each of the first plating film and the second plating film, wherein a material forming the fourth plating film differs from a material forming each of the first plating film, the second plating film, and the third plating film, wherein the material forming each of the first plating film and the second plating film is a metal other than a noble metal, wherein the material forming the fourth plating film is a noble metal, wherein the method further comprises (h) between the (a) and the (b), forming a MOSFET in the semiconductor substrate, wherein the (c) includes:

(c4) forming a first wiring and a second wiring on the interlayer insulating film;

(c5) forming a first insulating film on the interlayer insulating film to cover the first wiring and the second wiring; and (c6) forming a first opening in the first insulating film to expose a first portion of the first wiring and forming a second opening in the first insulating film to expose a second portion of the second wiring, wherein the first pad is the first portion of the first wiring exposed in the first opening, wherein the second pad is the second portion of the second wiring exposed in the second opening, wherein the first pad is electrically connected to a source region of the MOSFET, and wherein the second pad is electrically connected to a drain region of the MOSFET or a gate electrode of the MOSFET.

2. The method according to claim 1, wherein a thickness of the second plating film is greater than a thickness of each of the third plating film and the fourth plating film.

3. The method according to claim 2, wherein the material forming each of the first plating film and the second plating film is copper, wherein the material forming the third plating film is palladium, and wherein the material forming the fourth plating film is gold.

4. A method of manufacturing a semiconductor device, the method comprising:

(a) preparing a semiconductor substrate having an upper surface;

(b) forming an interlayer insulating film on the upper surface of the semiconductor substrate;

(c) forming a first pad and a second pad having a smaller plane area than a plane area of the first pad on the interlayer insulating film;

(d) forming a seed layer on the first pad and the second pad by a sputtering method;

(e) forming a first plating film on the seed layer on the first pad by an electrolytic plating method;

(f) forming a third plating film on the seed layer on the second pad by an electrolytic plating method; and (g) forming a fourth plating film on the third plating film by an electrolytic plating method, wherein a material forming the third plating film differs from a material forming the first plating film, wherein a material forming the fourth plating film differs from a material forming each of the first plating film and the third plating film, wherein the material forming the first plating film is a metal other than a noble metal, wherein the material forming the fourth plating film is a noble metal, wherein the method further comprises (h) between the (a) and the (b), forming a MOSFET in the semiconductor substrate, wherein the (c) includes:

(c4) forming a first wiring and a second wiring on the interlayer insulating film;

(c5) forming a first insulating film on the interlayer insulating film to cover the first wiring and the second wiring; and (c6) forming a first opening in the first insulating film to expose a first portion of the first wiring and forming a second opening in the first insulating film to expose a second portion of the second wiring, wherein the first pad is the first portion of the first wiring exposed in the first opening, wherein the second pad is the second portion of the second wiring exposed in the second opening, wherein the first pad is electrically connected to a source region of the MOSFET, and wherein the second pad is electrically connected to a drain region of the MOSFET or a gate electrode of the MOSFET.

5. The method according to claim 4, wherein the material forming the first plating film is copper, wherein the material forming the third plating film is palladium, and wherein the material forming the fourth plating film is gold.

* * * * *